US006339239B1

United States Patent
Alsmeier et al.

(10) Patent No.: US 6,339,239 B1
(45) Date of Patent: Jan. 15, 2002

(54) DRAM CELL LAYOUT FOR NODE CAPACITANCE ENHANCEMENT

(75) Inventors: Johann Alsmeier, Radebeul (DE); Carl John Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/603,439

(22) Filed: Jun. 23, 2000

(51) Int. Cl.⁷ .............................................. H01L 27/108
(52) U.S. Cl. ...................... 257/296; 257/301; 257/302
(58) Field of Search ................... 257/296, 301, 257/302

(56) References Cited

U.S. PATENT DOCUMENTS

| | | | | |
|---|---|---|---|---|
| 5,555,519 A | * | 9/1996 | Takashima et al. | 365/63 |
| 5,747,844 A | * | 5/1998 | Aoki et al. | 257/296 |
| 5,909,044 A | | 6/1999 | Chakravarti et al. | 257/301 |
| 5,959,321 A | * | 9/1999 | Lee et al. | 257/296 |
| 5,977,579 A | | 11/1999 | Noble | 257/302 |
| 6,004,844 A | | 12/1999 | Alsmeier et al. | 438/246 |
| 6,026,010 A | * | 2/2000 | Ema et al. | 365/149 |
| 6,037,208 A | | 3/2000 | Wei | 438/243 |
| 6,097,621 A | * | 8/2000 | Mori | 265/63 |

OTHER PUBLICATIONS

IBM Technical Disclosure Bulletin, entitled "High Density Vertical DRAM Cell", Article No. 86A 62504, Oct. 1986, pp. 2335–2340.

* cited by examiner

Primary Examiner—T. N. Quach
(74) Attorney, Agent, or Firm—John Jordan

(57) ABSTRACT

A layout pattern for increasing the spacing between the deep trenches of one cell pair and the deep trenches of an adjacent cell pair in an array of semiconductor DRAM cell pairs each of which cell pairs share a common bitline contact to bitlines arranged in one direction and each of which cell pairs are coupled to gate conductors arranged orthogonal to the bitlines. The layout pattern is formed by positioning the deep trenches of all of said pairs along alternate bitlines so they are offset from said bitlines along gate conductors in opposing directions. The deep trenches of all of the remaining bitlines are offset from said bitlines in opposing directions opposite to the opposing directions of said trenches along said alternate bitlines so as to form a herringbone pattern of cells.

8 Claims, 5 Drawing Sheets

DRAM CELL LAYOUT FOR NODE CAPACITANCE ENHANCEMENT

CROSS REFERENCE TO RELATED APPLICATIONS

Aspects of the present invention are related to subject matter disclosed in co-pending applications entitled "Structure and Process for 6F2 Trench Capacitor DRAM Cell with Vertical MOSFET and 3F Bitline", Ser. No. 09/602,426 filed Jun. 23, 2000 and, "Process Flow for Maskless Single Sided Buried Strap Formation of Vertical Cell", Ser. No. 09/603,442, filed Jun. 23, 2000 each assigned to the assignee of the present invention.

BACKGROUND OF THE INVENTION

1. Field of the Invention

The present invention generally relates to dynamic random access memory (DRAM) cells. More particularly, the present invention relates to the layout or positioning pattern of the deep trenches of cell pairs of an array of deep trench capacitor DRAM cells such as to increase the spacing between adjacent trenches of different cell pairs.

2. Background and Related Art

DRAM cells typically comprise a storage capacitor and insulated gate field effect transistor In order to achieve higher density DRAM devices, DRAM cells have been successively scaled down in size to the submicron range. However, as a result of the reduction in size, cell capacitance is reduced which reduction can lower the signed-to-noise ratio, increase refresh frequency, increase device error, etc.

Efforts to increase density and yet maintain the required level of capacitance has led to the development of the trench capacitor wherein the cell capacitor is formed in a trench structure within the silicon substrate. This not only reduces silicon surface area used for the capacitor, it also allows increased capacitor plate areas to be fabricated vertically without a corresponding increase in silicon surface area to thereby increase storage capacitance. Some such storage trench DRAM capacitors have been characterized as Merged Isolation and Node Trench (MINT) DRAM cells. To further increase capacitor plate areas without a corresponding increase in used silicon surface area, techniques have been developed called "bottling" wherein the lower portion of a deep trench is made larger than the upper portion creating a bottle-like shape or profile.

Even with the development of the trench capacitor and the deep trench bottle-shaped capacitor, increasing demand for higher density DRAM cell arrays has created a need for further bottle-shaped trench capacitance enhancement whereby the volume of the cavity in the lower portion of the storage trench may be further increased. It is apparent that the need for this increased capacitance is brought about, in part, by the fact that growing DRAM density tends to scale down cell size, and therefor trench plate size, while at the same time the voltage levels remain the same and the time between refresh for each cell increases as the number of cells increase.

However, it has been found that bottle-shaped trench capacitance enhancement is limited by the proximity of adjacent trenches and the necessity of maintaining the structural integrity of the trench capacitor. Typical prior art layout spacing between deep trench (DT) cells is 1F, 1F being the minimum lithographically-defined feature, where the minimum resolvable spatial pitch of an array of features would comprise 1F lines and 1F spaces with the minimum pitch thus being 2F. An F/3 radial enhancement through "bottling" in the lower portion of the trench results in a DT-to-DT spacing of F/3 at the widest point of the bottles. It has been found that to maintain structural integrity a DT-to-DT spacing of at least F/3 is required thereby limiting the extent of bottle enhancement to F/3.

Typical prior art efforts to improve cell layout, so as to maintain or increase feature spacing and reduce the silicon surface area utilized, have been directed to configuring cell shape and cell position so that cell access structure, such as wordline structure, is located, at least partially, over the trench capacitor. An example of such prior art effort is U.S. Pat. No. 6,004,844 entitled "Unit Cell Layout and Transfer Gate design For High Density DRAMs".

SUMMARY OF THE INVENTION

In accordance with the teachings of the present invention, a DRAM cell layout pattern is provided such as to increase the spacing between adjacent trenches of different cell pairs over prior art MINT DRAM cells. More particularly, the individual DTs of an array of DRAM cells are positioned in the array so as to significantly increase the spacing between adjacent DT's. The positioning pattern of the DT array is such as to increase the spacing between the trench openings at the silicon surface to 1.3F to 1.7F. Such spacing between trench openings at the silicon surface permits bottle-shaped trench capacitance radial enhancement by a factor of approximately F/2, yet maintains the spacing between the widest points of the bottles to F/3.

The improved spacing between adjacent DTs, in accordance with the present invention, is achieved by offsetting in opposing directions, on each side of a bitline, the pair of DTs of cell pairs sharing a common bitline contact. A first offset pattern is carried out for all DTs along alternate bitlines. A second, opposite, offset pattern is carried out for all DTs along the remaining bitlines. The offset from the bitline is at an angle of approximately 45° and is such as to provide increased spacing to approximately 1.5F between the DTs of one cell pair and the DTs of adjacent cell pairs. In accordance with the present invention, such increased spacing permits greater "bottling" for node capacitance enhancement. The offset pattern also allows the pair of DTs of cell pairs sharing a common bitline contact to increase the overlap of the active area (AA) and DT where the cells employ a trench sidewall vertical transistor. Where the cells employ a planar transistor, the AA pattern may be lengthened to minimize electrical interaction between devices within the AA pattern.

Accordingly, it is an object of the present invention to provide node capacitance enhancement in deep trench DRAM cells.

It is another object of the present invention to provide DRAM cell node capacitance enhancement while at the same time maintaining the DT-to-DT spacing required for structural integrity of the capacitor.

It is yet another object of the present invention to provide an improved DRAM cell layout.

It is a further object of the present invention to provide a trench capacitor DRAM cell array layout which increases the trench-to-trench spacing for a given F dimension thereby allowing enhanced capacitance while maintaining DT and capacitor structural integrity.

DETAILED DESCRIPTION

Figure 1:
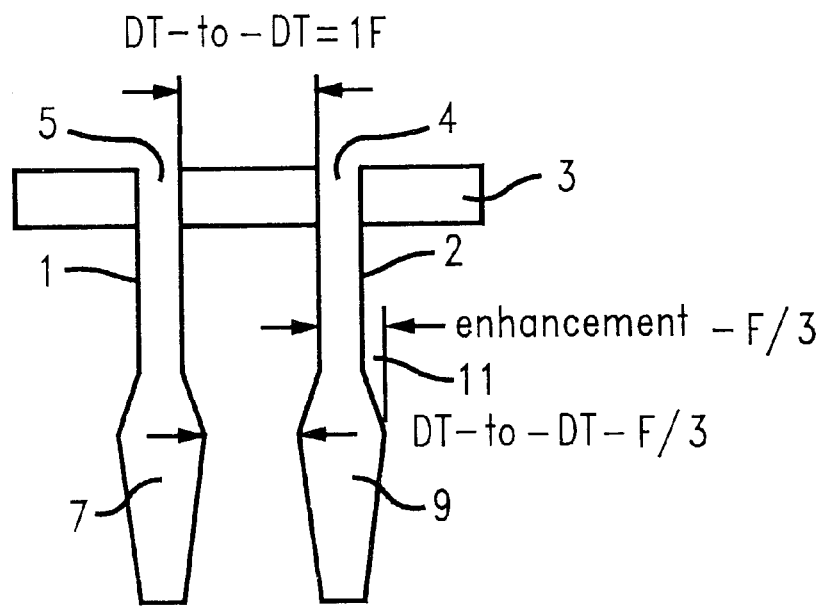
FIG. 1 shows a cross-section of the relationship in spacing between typical prior art DTs using "bottling" to increase storage capacitance.

It should be understood that the various DRAM cell features shown in the drawings and described herein are not to scale but are merely provided to facilitate an understanding of the description of the invention.

With reference to FIG. 1, there is shown a schematic cross-sectional view of a pair of adjacent prior art DRAM trenches 1 and 2. The trenches are formed in a substrate, as is known to those skilled in the art, such as single crystalline silicon. The trenches would normally be isolated from one another and require at least F/3 spacing for structural and electrical integrity. Such trenches are typically anisotropically etched through a dielectric surface pad 3, such as silicon nitride, into the silicon substrate (not shown).

The upper portions 4 and 5 of the trenches are, as shown, 1F apart, i.e., DT-DT=1F. As is understood by those skilled in the art, storage capacitors are formed in lower portions 7 and 9 of the DTs. However, a "bottling" process may first be employed to enlarge the surface area of the lower portions of the DTs to increase storage capacitance over what would normally exist only using the straight trench sidewalls of an anisotropically etched DT. Such has been described by Rupp, et al. in an article entitled "Extending Trench DRAM Technology To 0.15 μm Groundrules and Beyond", IEDM, 1999, p. 33. The bottle-shaped profile may also be introduced during the formation of the DT capacitor by the selection of the trench dry etch parameters, such as wafer chuck temperature, or adjustment of the chemical composition of the dry etch feedgas mixture including some combination of gas, such as $NF_3$, $O_2$, He, HBr, $CF_4$ or $SiCl_4$. Alternatively, the bottle profile may be formed after the trench etching process by the application of anisotropic or isotropic etching to the lower region of the trench with a thin masking layer applied to the upper region of the trench. It should be noted that the terms "trench" an "DT" are to be taken as one and the same, and are used herein interchangeably.

As previously described, DT capacitance enhancement is limited by the structural integrity requirement of maintaining a DT-to-DT spacing at the widest point of the bottle-shaped trenches of at least F/3. This is shown by the arrows in the bottle portion of the trenches of FIG. 1. Thus, to retain at least this F/3 spacing between the bottled-shaped trenches, enhancement through the bottling process is limited to a diameter increase of approximately F/3 from the edge of each trench. This enhancement is depicted at 11 by the arrows on trench 2 above the bottle portion.

Figure 2:
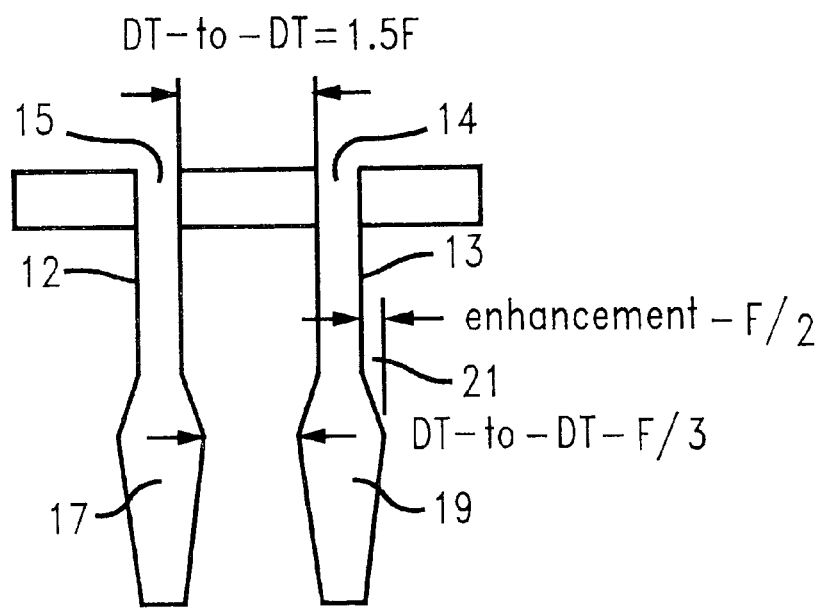
FIG. 2 shows a cross-section of the relationship in spacing between DTs in accordance with the present invention.

FIG. 2 shows a schematic cross-sectional view of a pair of DRAM trenches 12 and 13 which are 1.5F apart, i.e., DT-to-DT=1.5F at the upper portions 14 and 15 of the trenches. In accordance with the present invention, with a DT-to-DT spacing of 1.5F, the bottling process may be used to provide a diameter increase of approximately F/2 from the edge of each trench as shown at 21. More particularly, a diameter enhancement (and thus capacitance enhancement) of 0.58F per edge is possible, while at the same time maintaining the minimum DT-to-DT spacing of F/3.

Figure 3:
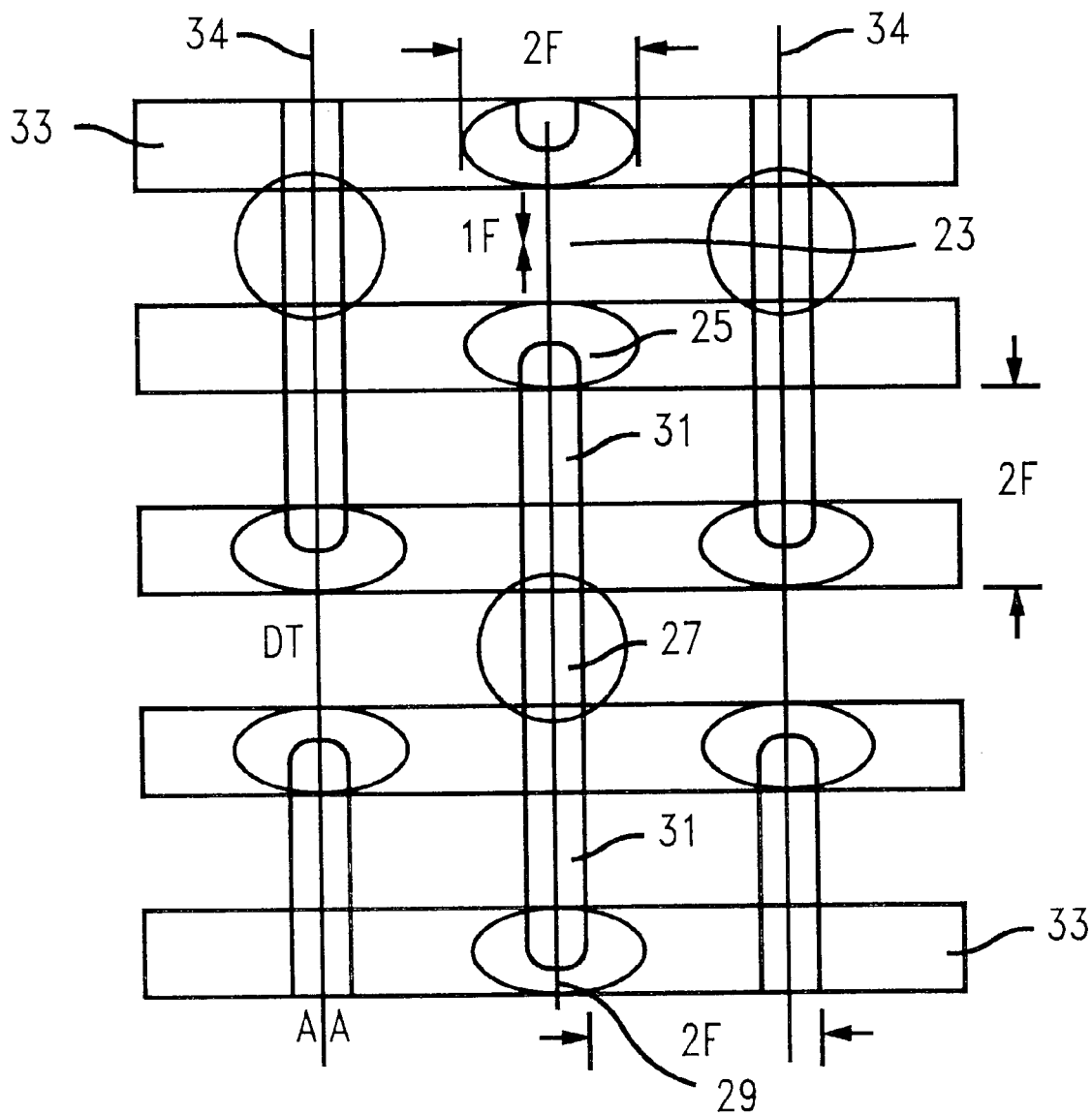
FIG. 3 shows a typical prior art planar transistor DRAM MINT plan-view cell layout.

FIG. 3 shows a typical prior art planar transistor DRAM MINT plan view of a cell layout pattern with a DT-to-DT spacing of 1F, as described by Rupp, et al., cited above. Pairs of DTs 25 and 29 of cell pairs share a common bitline contact 27. The DTs intersect the active area patterns 31 (AAs) at the buried strap node connection, and the transistor channels are formed at the overlap of the gate conductors 33 and the AAs. The bitline contact, shared by each cell pair, is placed at the center of the AAs. As can be seen at 23, the spacing between adjacent DTs of different cell pairs along bitline 34 is 1F.

Figure 4:
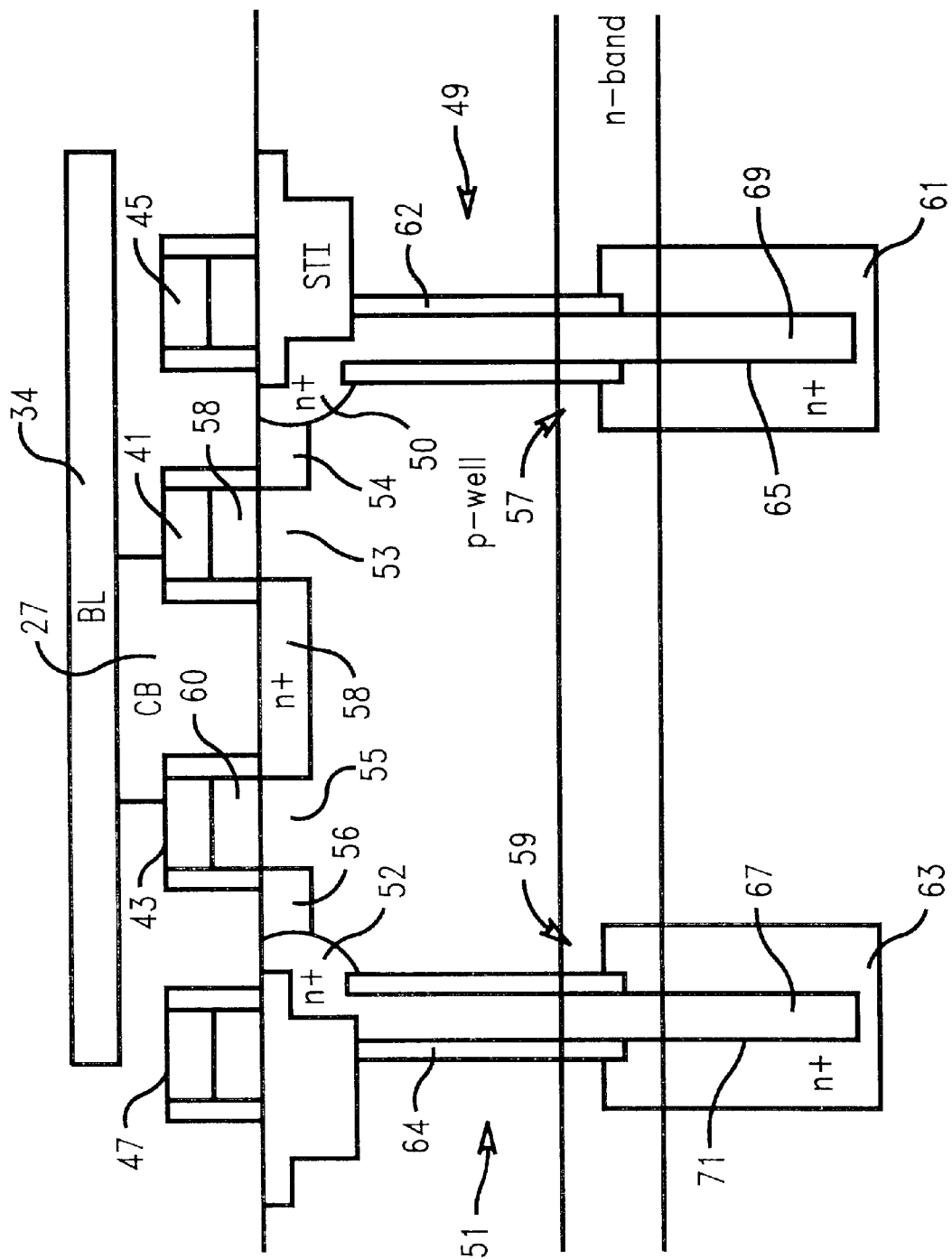
FIG. 4 shows a cross-section of a typical prior art planar transistor trench DRAM unit cell used in the DRAM MINT cell layout of FIG. 3.

FIG. 4 depicts a cross-section view through the planar transistor cell pairs in FIG. 3 in the plane of the active area 31, with the DTs of the cell pairs sharing bitline contact 27. Active wordlines 41 and 43 pass over the active area, and passing wordlines 45 and 47 pass over DT regions 49 and 51. Field effect transistors (FETs) are formed by the active wordlines 41 and 43 where they pass over the active area to form channel regions 53 and 55. The passing wordlines serve as active wordlines in the DT cells directly adjacent.

As is understood by those skilled in the art, DT regions 49 and 51 include node capacitors 57 and 59 in the lower portion of the trenches comprising buried plates 61 and 63, node dielectrics 65 and 71 and storage nodes 67 and 69. Strap diffusion regions 50 and 52 at the top of the storage node merge with source/drain diffusion regions 54 and 56 at the substrate surface. Isolation oxide collars 62 and 64 act to reduce parasitic leakage. Gate electrode structures comprising gate conductors 58 and 60, over gate oxide layers (not shown), act to couple the source/drain diffusion regions 54 and 56 to diffusion region 58 beneath bitline contact 27 to thereby form a pair of FETs sharing bitline contact 27.

Figure 5:
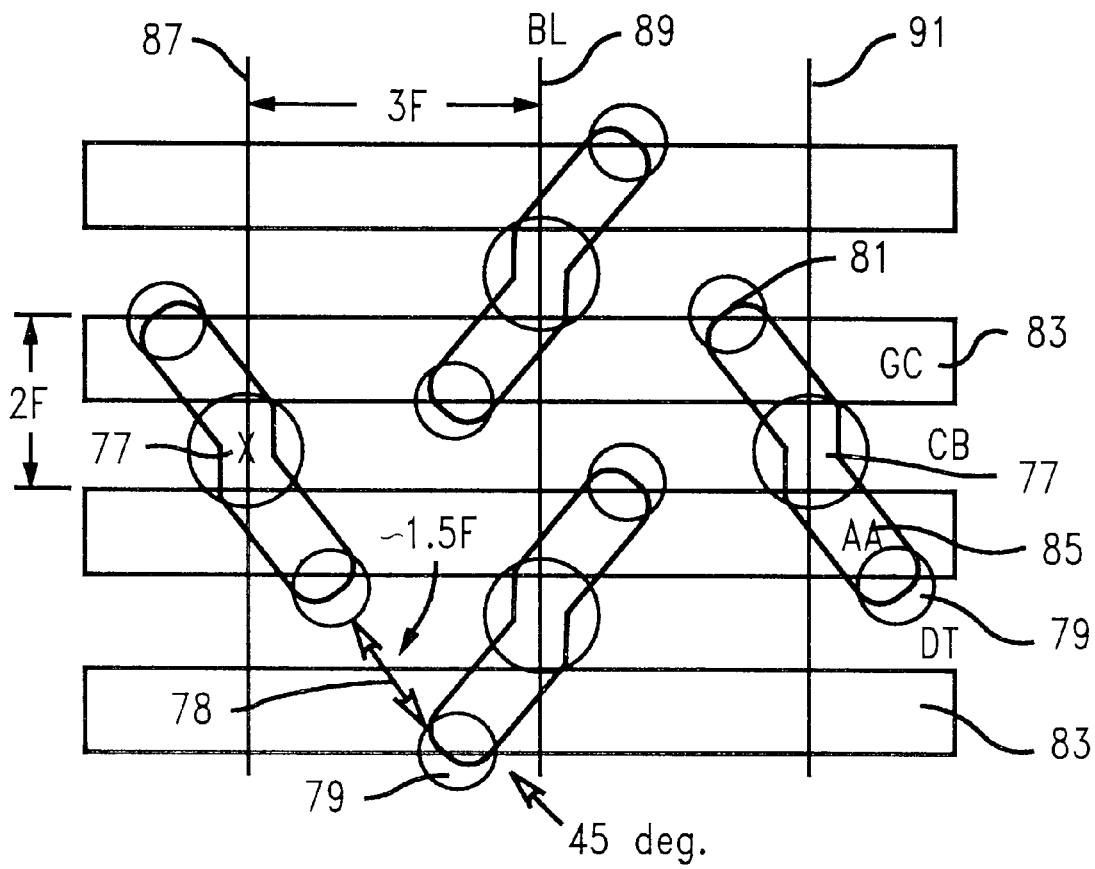
FIG. 5 shows the DRAM MINT plan-view cell layout in accordance with the present invention.

A plan view of the DT cell layout pattern, in accordance with the present invention, is shown in FIG. 5. As was described with respect to the MINT cell layout pattern of FIG. 3, DT pairs 79 and 81 of cell pairs share a common bitline contact 77. As was also described with respect to FIG. 3, where a planar transistor is employed in the cells of FIG. 5, the DTs intersect the AAs 85 at the buried strap node connection, and the transistor channels are formed at the overlap of the gate conductors 83 and the AAs. The DT cell layout pattern shown in FIG. 5 achieves approximately 1.5F spacing between adjacent DTs of different cell pairs, as shown at 78, by offsetting the DT pairs of cell pairs in opposing directions from bitlines 87, 89 and 91.

As can be seen, the bitlines run through the center of bitline contacts 77 and are generally orthogonal to gate conductors 83. As also can be seen, the offset pattern alternates from bitline to bitline. This can be seen in FIG. 5 wherein the offset of the two pairs of cells (79 and 81) along bitline 89 are offset opposite to those shown along adjacent bitlines 87 and 91. The angle of the DT offset from the bitlines is approximately 45°.

It should be noted that by offsetting the DT cells in alternating fashion, the overlap of the AA pattern with the DTs may be increased for applications using vertical transistor cells. For applications using planar transistor cell arrangements, the AA pattern may be lengthened, at the expense of the DT-to-DT spacing. The AA pattern length extension, in the case of the planar cell, is desirable to minimize the electrical interaction between devices within the AA pattern.

Figure 6:
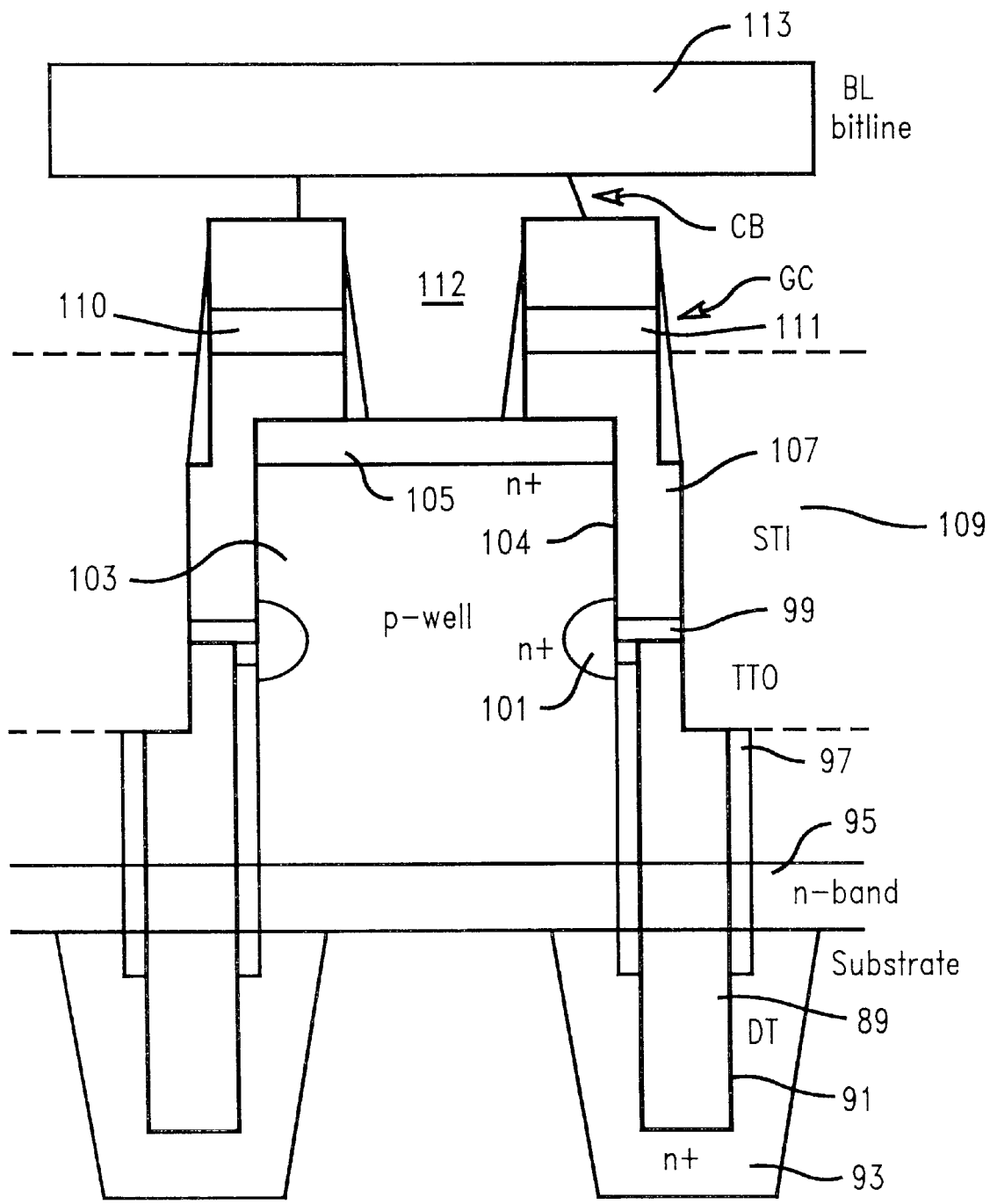
FIG. 6 shows a cross-section of a trench sidewall vertical transistor DRAM unit cell arrangement which may be utilized in cell layout of FIG. 5.

FIG. 6 shows a cross-section of trench sidewall vertical transistor cell pairs taken through the center of each DT and the bitline contact 77, as shown in FIG. 5. The cells include a node capacitor in the lower portion of the trench comprising a storage node 89 separated from buried plate 93 by node dielectric 91. N-band 95 connects the buried plates. Isolation oxide collar 97 acts to reduce parasitic leakage and trench top oxide (TTO) 99 isolates the node capacitor from the vertical FET. Buried strap diffusion region 101 and bitline source/drain diffusion region 105 within P-well 103, along with gate dielectric 104 and gate conductor 107, comprise the vertical FET. Shallow trench isolation (STI) 109 isolates the cell pairs from adjacent cell pairs.

As can be seen in FIG. 6, wordlines 110 and 111 are separated by bitline contact 112 which contact connects the source diffusion region 102 to bitline 113. The wedge-shaped regions between wordlines 110–111 and bitline contact 112, and the rectangular regions on top of wordlines 110 and 111 are insulating regions insulating the wordlines and gate conductors from bitline contact 112. Thus, as shown in FIG. 6, adjacent wordlines 110 and 111, and their underlying gate conductors 107, partially overlap their respective DTs. With reference to the layout pattern of FIG. 5, this allows the DT pairs to be moved closer to bitline contacts 77 along the AA pattern so that the DTs are further overlapped by the gate conductors 83. Thus, because of the close spacing conditions of the DT pairs using the vertical transistor, the AA patterns are substantially reduced. It should be noted that the overlap between the AA and DT is controlled by the intrinsic nature of the self-aligned buried strap trench sidewall vertical transistor DRAM process.

Thus, the DT layout pattern of FIG. 5 is readily applicable to use of the trench sidewall vertical transistor cell, as shown in FIG. 6. The layout provides a DT-to-DT spacing of approximately 1.5F between adjacent DTs of different cell pairs and, hence, enables increased capacitance enhancement through use of the bottle-type profile trench.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. In a DRAM deep trench semiconductor cell array having a plurality generally parallel bitlines arranged in one direction and a plurality of generally parallel gate conductors arranged in the opposite direction, a deep trench cell layout pattern of deep trench cell pairs each of which cells of said cell pairs share a common bitline contact connected to said bitlines, comprising:

a first offset pattern of the trenches of said cell pairs that are connected to first alternate ones of said bitlines wherein each trench of said cell pairs along said alternate ones of said bitlines is offset from said bitlines along respective ones of said gate conductors in the same opposing first direction; and a second offset pattern of trenches of cell pairs electrically connected to second alternate ones of said bitlines between said first alternate ones of said bitlines wherein each trench of said cell pairs along said second alternate ones of said bitlines is offset from said bitlines along respective ones of said gate conductors in the same opposing second direction in opposite direction to that of said first directions of said first offset pattern to thereby form a herringbone pattern of cells.

2. The DRAM semiconductor cell array of claim 1 wherein said offset is at an angle of approximately 45° with respect to said bitlines.

3. The DRAM semiconductor cell array of claim 1 wherein the upper portion of the trenches of said cell pairs are thereby spaced approximately 1.5 F from the upper portion of the trenches of adjacent cell pairs.

4. The DRAM cell array of claim 1 wherein the lower portion of said trenches of said cell pairs have a diameter of at least F/2 larger than the diameter of the upper portion of said trenches to form a bottle-shape profile to increase cell capacitance.

5. The DRAM semiconductor cell array of claim 4 wherein said cells comprise a node capacitor in said trenches and a planar transistor coupled thereto at the surface of the substrate of said semiconductor cell array.

6. The DRAM semiconductor cell array of claim 4 wherein said cells comprise a node capacitor in said trenches and a trench sidewall vertical transistor coupled thereto above said node capacitor.

7. The DRAM semiconductor cell array of claim 6 wherein each cell of said cell pairs share the same semiconductor active area.

8. The DRAM semiconductor cell array of claim 7 wherein the lower portion of said trenches of said cell pairs has a diameter of approximately 0.58 larger than the diameter of the upper portion of said trenches and the spacing of said upper portion of said trenches of said cell pairs is approximately 1.5 F from the upper portion of the trenches of adjacent cell pairs.

* * * * *